United States Patent [19]

Guess

[11] 4,190,782

[45] Feb. 26, 1980

[54] PIEZOELECTRIC CERAMIC RESONANT TRANSDUCER WITH STABLE FREQUENCY

[75] Inventor: Joe F. Guess, Cedar Rapids, Iowa

[73] Assignee: Telex Communications, Inc., Minneapolis, Minn.

[21] Appl. No.: 927,546

[22] Filed: Jul. 24, 1978

[51] Int. Cl.[2] ........................................ H01L 41/10

[52] U.S. Cl. ................................ 310/324; 310/346

[58] Field of Search ........................... 310/324, 346; 179/110 A

[56] References Cited

U.S. PATENT DOCUMENTS

| | | | |
|---|---|---|---|
| 2,714,642 | 8/1955 | Kinsley | 179/110 A X |
| 2,834,952 | 5/1958 | Harris | 179/110 A X |
| 2,947,823 | 8/1960 | Harris | 179/110 A X |
| 3,206,558 | 9/1965 | Shoot | 310/324 X |
| 3,437,849 | 4/1969 | Treatch et al. | 310/346 X |
| 3,683,129 | 8/1972 | Roos et al. | 179/110 A |
| 3,828,210 | 8/1974 | Livenick et al. | 310/346 |
| 3,876,891 | 4/1975 | Schubotz | 310/346 |
| 3,943,389 | 3/1976 | Hickernell | 310/346 X |
| 4,047,060 | 9/1977 | Schafft | 310/324 X |

*Primary Examiner*—Mark O. Budd
*Attorney, Agent, or Firm*—Charlton M. Lewis

[57] ABSTRACT

The invention reduces variability of the resonant frequency in piezoelectric ceramic transducers having a vibratory assembly comprising a flexible diaphragm carrying a ceramic disk sensor. The clamped edge of the diaphragm is typically offset from the plane of the vibratory assembly and is coupled to that assembly by generally cylindrical structure having flexibility in a radial direction. That flexibility partially isolates the vibratory assembly from effects such as structural variability of the clamping means and differential thermal expansion at the clamp. The degree of that isolation is preferably selected by suitable design of the coupling structure to provide approximate compensation for thermal effects due to other parameters of the system.

2 Claims, 5 Drawing Figures

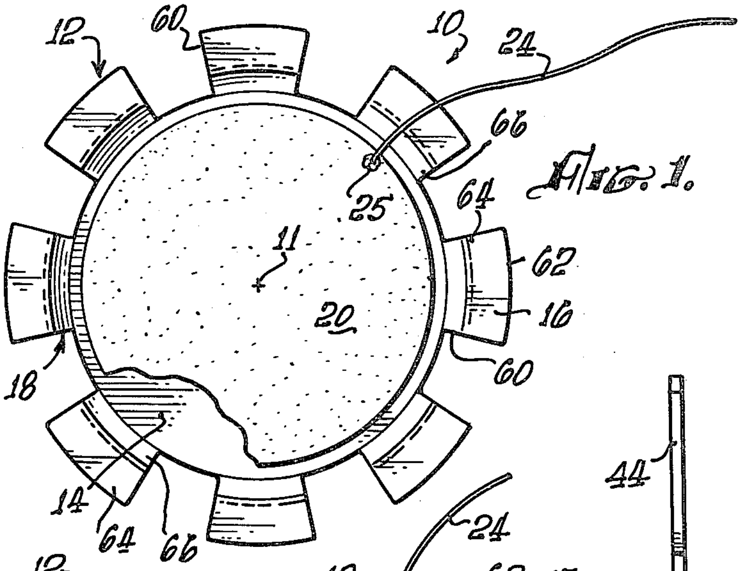
Fig. 1.
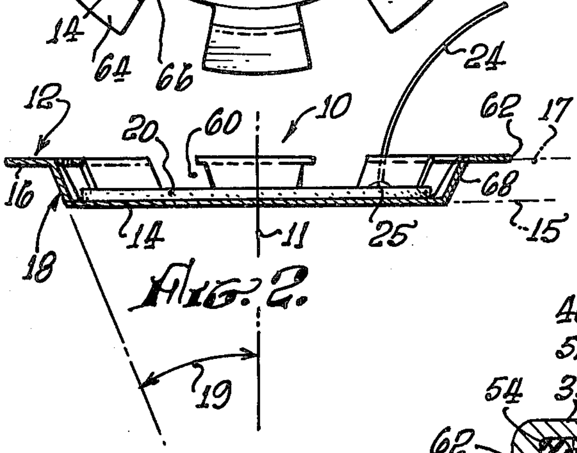
Fig. 2.
Fig. 3.
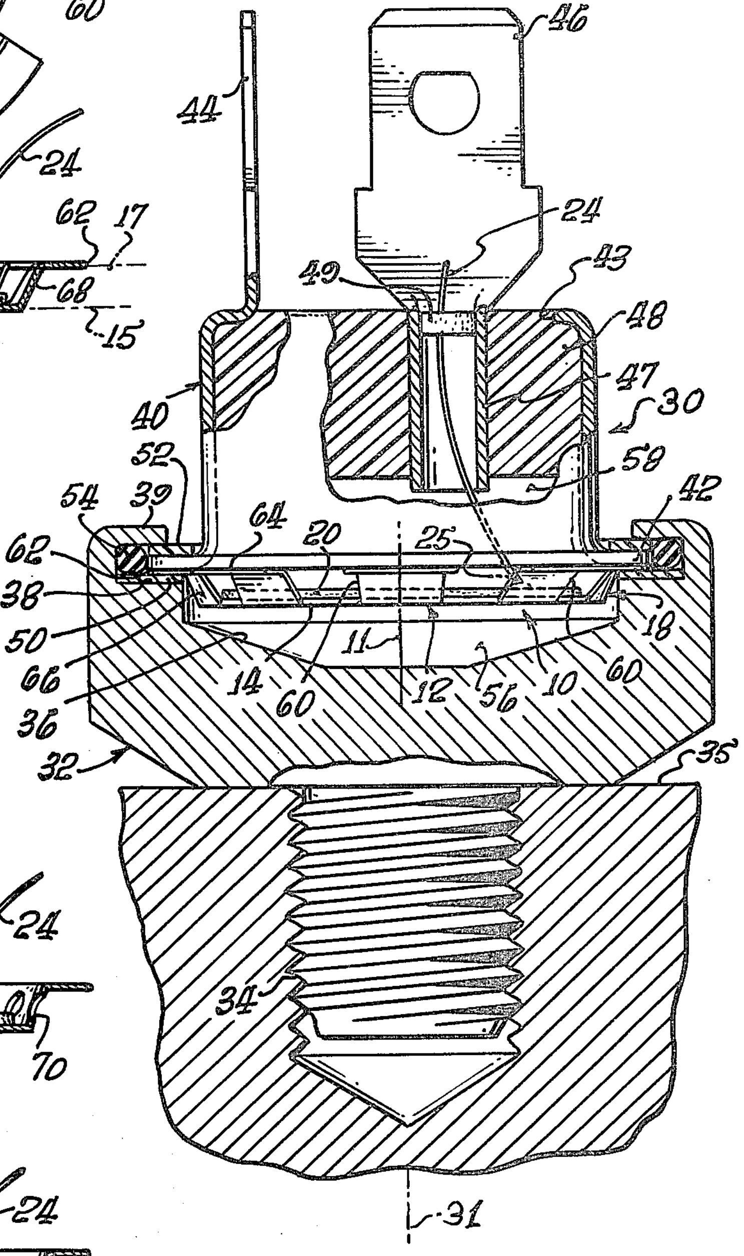
Fig. 4.
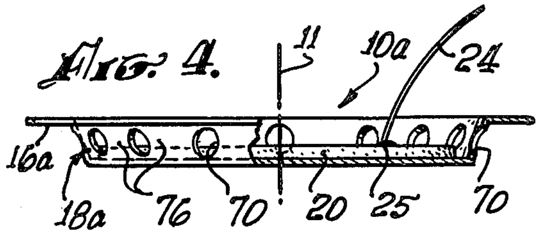
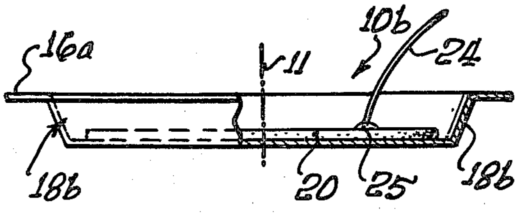
Fig. 5.

PIEZOELECTRIC CERAMIC RESONANT TRANSDUCER WITH STABLE FREQUENCY

BACKGROUND OF THE INVENTION

This invention has to do with piezoelectric resonant transducers in which a vibratory diaphragm member is edge mounted and carries a piezoelectric ceramic disk mounted coaxially on at least one of its faces for sensing or driving flexure of the diaphragm.

Flexure of the central portion of the diaphragm member perpendicular to its plane is associated with radial stretching or compression of the ceramic. Those stresses are accompanied by electrical potentials of opposite polarity at the respective disk surfaces, corresponding to the piezoelectric properties of the material. Electrodes connect the opposite faces of the disk with an external circuit of any desired type.

It is well known that such piezoelectric ceramic transducers are useful for sensing and for generating vibratory movement of many different types. In one class of such transducers the diaphragm assembly has a face in direct or indirect contact with a liquid medium or a mechanical member, by which it is constrained against free vibration. Such transducers can interchange energy with the contacted medium or member with moderate efficiency over a broad range of frequencies, which may or may not include the resonant frequency that the diaphragm assembly would have if free. Patent 3,489,995 to J. Laurent describes such a transducer, in which the diaphragm assembly is constrained by direct contact with an elastic cover on one side and by a protective back-up plate closely spaced on the other side.

The present invention is concerned with a different class of piezoelectric transducers in which the diaphragm and its carried disk of ceramic are free to flex in fundamental mode at their natural or resonant frequency of vibration. Under that condition the transducer is a highly sensitive detector of vibrations at that same resonant frequency; and can drive such vibrations with good efficiency in response to an input periodic electrical signal.

In order to insure optimum sensitivity of selective response at a sharply defined target frequency, whether for detection or generation of vibrations, it is important that the resonant frequency of vibration of the transducer match that target frequency as closely as possible, and also that the diaphragm housing structure permit the diaphragm to vibrate freely at its normal resonant frequency.

The utility of such selectively responsive transducers has been limited in the past by difficulty in producing economical transducers having a well-defined resonant frequency that is satisfactorily uniform and stable. Under conditions of mass production, especially when the production cost must be held to a minimum, individual transducers tend to differ in resonant frequency over a range that is excessive for many applications.

In accordance with one aspect of the invention, it has been discovered that much of the variability in frequency between individual transducers is due to small variations in the edge-clamping structure, and in the manner in which that clamping structure engages the periphery of the vibratory diaphragm. Even a small change in effective diameter of the annular clamped region can alter the resonant frequency; and a lack of symmetry in the clamping action, such as may be caused by imperfect assembly, for example, appears to alter the response to vibration by modifying the mode of vibration.

Also, the resonant frequency is ordinarily sensitive to changes in temperature. For some applications, including those in the automotive field, for example, the resonant frequency must remain as uniform as possible over a temperature range of several hundred degrees, for example from about −40° to +300° F. When a transducer is cycled over any such temperature range, the resonant frequency ordinarily varies appreciably, due in large part to stresses developed by differing thermal expansion of its various components.

More particularly, the materials most suitable for clamping the rim of the diaphragm, such as stainless steel, for example, have coefficients of thermal expansion appreciably higher than the materials ordinarily used for the diaphragm member. Under that condition, increasing temperature causes the mounting to expand faster than the clamped diaphragm rim, tending to stress the diaphragm radially outward and thereby increase the resonant frequency.

BRIEF DESCRIPTION OF THE INVENTION

An important object of the invention is to provide structure and methods for improving the uniformity and thermal stability of the resonant frequency in piezoelectric ceramic resonant transducers of the described type without significantly increasing the production cost.

A more particular object of the invention is to reduce the variability of resonant frequency from one transducer unit to another due to structural differences in the clamping action.

A further object is to control frequency variability with temperature due to differential expansion of the clamp structure relative to the diaphragm member.

Frequency variability due to causes such as those described is controlled by the invention by modifying the flexibility of the diaphragm member at a limited zone close to the structural cause of the variability to be controlled. More particularly, the diaphragm flexibility is typically modified at a zone between the mounting portion and the diaphragm portion of the diaphragm member in a manner to dynamically isolate the vibratory portion of the diaphragm from the source of disturbance.

Such isolation is typically obtained by inserting between the vibratory and rim portions of the usual diaphragm member coupling structure that is relatively stiff in a direction parallel to the axis of symmetry of the transducer, and relatively soft in the radial direction. The two diaphragm portions are preferably mutually offset from their usual coplanar relation and are held by the coupling structure quite rigidly in respective axially spaced planes, but with more flexible definition of their mutual radial relation. The coupling structure typically comprises a generally cylindrical section that directly joins the inner edge of the clamped rim portion and the outer edge of the central vibratory portion of the diaphragm member. Such a generally cylindrical coupling section is preferably formed as an integral part of the diaphragm member.

The described integral structure is typically produced from a flat metal disk by conventional metal forming techniques, yielding a diaphragm member having a shallow "hat" configuration. The resulting product can be made economically and with a very high degree of uniformity, both dimensionally and in metallographic properties. The ceramic disk is preferably mounted on the diaphragm face inside the cylindrical cup, providing a reference for accurately centering the sensor without special fixturing.

When the rim is held by conventional clamping means, any spurious stresses or other non-uniformities resulting from the clamping action are communicated to the diaphragm proper only to a limited extent. In particular, radial stresses are attenuated by the relative flexibility of the coupling section in the radial direction, while the axial stiffness of that section tends to maintain a definite axial spacing between the inner edge of the clamped rim portion and the outer edge of the diaphragm proper. The coupling section may thus be viewed as improving the frequency uniformity by providing a reproducible edge condition to the vibrating ceramic sandwich.

The described coupling section also substantially isolates the diaphragm proper from radial tension or compression due to differential expansion with temperature between the diaphragm mounting portion and the clamping structure. The resonant frequency of vibration of the diaphragm assembly is thus made relatively independent of such thermal stresses.

The invention further provides means for selectively obtaining a desired degree of such isolation of the diaphragm proper from thermal strain due to the clamping structure. That isolation can be increased, for example, by increasing the axial depth of the coupling section, which tends to increase its overall flexibility. That flexibility can also be increased without altering the space requirements by locally removing material from one or both surfaces of the coupling section to produce a thinner and more flexible cross-section.

A preferred method of obtaining a desired degree of such flexibility is to form the coupling section with a selected pattern of openings, which may effectively divide the section circumferentially into a series of angularly spaced arms. The openings can be made by drilling or punching, for example, and may be formed either before or after an initially flat metal disk is formed to the described hat configuration. They may extend as radial slots into, or all the way across, the annular mounting portion of the diaphragm member. By suitable selection of the number and size of such openings a desired proportion of the thermal stress due to the clamping structure may be allowed to reach the diaphragm assembly.

Such selective design is especially useful for compensating small residual temperature effects due to other parameters of the structure. For example, although differential expansion of the ceramic sensor and its supporting diaphragm member can be greatly reduced by selection of materials for those components having closely similar coefficients of thermal expansion, the match cannot be perfect at all temperatures. Especially when abnormally wide temperature ranges are involved, appreciable deviations from equality may be unavoidable. It has been found that the resulting residual thermal effects generally cause the resonant frequency to decrease at elevated temperature. The present invention compensates such residual frequency variations by coupling to the diaphragm assembly a suitable selected amount of thermal stress from the mounting structure, which has been found to act in the opposite direction.

The described coupling structure has the further practical advantage that it takes part to a limited extent in the vibratory motion of the diaphragm. The periphery of the diaphragm proper more nearly approximates a perfect hinge support; the resulting strain in the ceramic is made more uniform, producing higher sensitivity and lowering the resonant frequency, much as if the diameter of the diaphragm portion had been increased. That frequency reduction has the advantage of being "free," in the sense that it is attained without the increased space requirement that would follow from an actual increase in diameter.

In view of the rather complex interactions of the effects that have been described, it is difficult to make accurate theoretical predictions of the behavior of the resonant frequency as a function of temperature and other environmental factors. Fortunately, however, the actual resonant frequency of an assembled transducer can be measured conveniently and accurately, as by externally vibrating the mount and observing the transducer output as a function of frequency. Different configurations can therefore be directly compared, and a detailed design meeting any particular set of requirements can readily be developed empirically.

BRIEF DESCRIPTION OF THE DRAWING

A full understanding of the invention and of its further objects and advantages will be had from the following description of certain preferred methods and apparatus for carrying it out. That description and the accompanying drawings which form a part of it are intended only as illustration and not as a limitation upon the scope of the invention.

In the drawings:

FIG. 1 is a plan, typically at enlarged scale, representing a diaphragm and sensor embodying the invention;

FIG. 2 is an axial section corresponding to FIG. 1;

FIG. 3 is an axial section representing an illustrative mounting and housing structure for the invention;

FIG. 4 is a combined elevation and axial section representing a modification; and FIG. 5 is a combined elevation and axial section representing a further modification.

The illustrative diaphragm assembly shown at 10 in FIGS. 1 and 2 comprises the circular metal diaphragm member 12 and the piezoelectric sensing element 20, which are coaxially assembled on the axis of symmetry 11. Diaphragm member 12 includes the central diaphragm portion 14 and the outer, generally annular mounting portion 16. Those diaphragm portions are axially offset in respective parallel planes, indicated schematically at 15 and 17, respectively, and are joined by the generally cylindrical coupling structure 18. That structure is preferably an integral part of the diaphragm member, which may be made by conventional forming or drawing of a single circular piece of sheet metal. As illustrated, such forming is facilitated by making the coupling structure somewhat conical in form, with the conical half angle 19 which is preferably less than about 30°.

Sensing element 20 typically comprises a disk of piezoelectric ceramic material that has been treated in known manner to produce a voltage difference between its two faces when bent out of its plane. The faces of the ceramic disk are made conductive, as by deposition of suitable electrode material. One disk face is adhered coaxially to a face of diaphragm portion 14, preferably on the side within coupling cylinder 18, as by a thin layer of epoxy cement which permits electrical contact between the two faces. The wire conductor 24 is typically soldered at 25 to the other disk face near its periphery. The electrical signal from sensor 20 may then be taken as a potential difference between conductor 24 as live terminal and diaphragm member 20 as ground terminal. If preferred, sensors may be mounted on both faces of the diaphragm, with electrical connections to their outer faces.

The central diaphragm portion of member 12 and the sensing disk 20 form a diaphragm assembly 22 which acts as an effectively integral vibrating element. The fundamental vibrating mode of that assembly comprises bending of the central area alternately upward and downward with resonant frequency corresponding to the combined masses, dimensions and elastic constants of the components, as modified by presence of coupling structure 18.

When it is desired to have the transducer sensitive to a particular frequency, the dimensions of the diaphragm assembly are chosen so that its fundamental resonance occurs close to that frequency, and the diaphragm assembly is mounted and housed in such a way that it is free to resonate without external interference. Presence of the selected frequency as a vibration in the surrounding atmosphere, or externally impressed upon the housing as a whole, for example, then causes the diaphragm and sensor to vibrate at an amplitude that is increased by resonance. The transducer thus becomes a highly sensitive instrument for detecting presence of vibrations of the selected frequency.

The dimensions and detailed form of the diaphragm member and sensor may vary within wide limits, being selected typically with primary reference to the desired value of the resonant frequency. The invention has been found highly effective, for example, in connection with a transducer in which the diaphragm member is of the order of one inch in overall diameter, and is formed of sheet material about 0.005 inch thick. The piezoelectric disk sensor for use with such a diaphragm is typically of the order of 0.010 inch thick with a diameter of 0.60 to 0.75 inch, yielding a resonant frequency in the neighborhood of 6 kHz.

Illustrative mounting and housing structure for sensing mechanical vibrations in a machine frame or other test member is represented at 30 in FIG. 3, with its axis of symmetry 31 shown vertical for illustration. The housing base 32 carries at its lower end suitable mounting structure, shown as the threaded coaxial boss 34, for rigidly mounting the instrument on the test member 35, which is to be monitored for appearance of the resonant frequency. The upper end of base 32 is coaxially hollowed to form the recess 36, surrounded by the upwardly facing annular mounting surface 38 and the relatively thin outer retaining flange 39, which can be rolled from an initial axial position to the clamping position shown.

The cover member 40 is of general cup shape with the flaring mounting rim 42. A generally circular opening 43 is cut in the flat cup base, and the trimmed flap is bent up to form a conventional electrical spade terminal, seen edge-on at 44. A second terminal 46 with a blade of similar shape and with an integral tubular conductor guide 47 is mounted in insulated relation in cover opening 43, as by the sealing wall 48 of potting compound. Conductor guide 47 forms a clear passage through that wall.

The described base and cover form a remarkably simple and convenient housing for mounting a piezoelectric transducer of the illustrative type shown in FIGS. 1 and 2. Rim portion 16 of the diaphragm member is supported on mounting surface 38 of base 32, preferably spaced from that surface by the spacing and centering ring 50 of electrically insulating material such as glass reinforced epoxy, for example. Conductor 24 is threaded through guide 47 of cover 40, and the cover is placed with its mounting flange 42 in direct mechanical and electrical contact with the upper face of transducer rim 16. The bare conductor 24 is then soldered to terminal 46 at 49, sealing the passage in guide 47, and the conductor is trimmed. The sealing O-ring 54 is inserted between the cover rim 42 and base flange 39, resting on spacing ring 50. A second spacing and insulating ring 52 is placed over the cover rim, and the assembly is firmly clamped together by rolling base flange 39 down onto ring 52, thus sealing the housing hermetically against external contamination.

The described mounting structure clamps diaphragm rim portion 16 rigidly between spacer 50 and metal cover rim 42, insuring good electrical contact between cover 40 and the diaphragm member and thereby connecting the lower face of sensor 20 to ground terminal 44. Resonant diaphragm assembly 22 is positioned in the housing with ample surrounding space to insure freedom of its vibratory movement. That space is provided by the lower chamber 56 within base recess 36 and the upper chamber 58 within cover 40.

The housing structure of FIG. 3 is merely illustrative, and can be varied as desired to meet special requirements, so long as the diaphragm assembly 22 remains free to vibrate without interference at its resonant frequency. For example, it may be desired to sense or to produce vibrations of a particular frequency in a gaseous medium such as air, rather than in a mechanical body such as test member 35. For that purpose, base 32 may be provided in known manner with mounting structure of any suitable type at its periphery to replace mounting stud 34, and the lower part of the base may be provided in known manner with adequate openings between chamber 56 and the exterior for passage of atmospheric vibrations.

In the illustrative embodiment of FIGS. 1 and 2 the radial flexibility of coupling section 18 is increased by providing the apertures 60, which are angularly spaced about axis 11. Those apertures have the form of slots, with generally radial sides and with square inner ends. The slots extend outward all the way to the outer periphery 62 of the diaphragm member. Rim portion 16 of the diaphragm member is divided by those slots into separate tabs, each of which is firmly clamped between the cover mounting rim and spacer 50. The generally cylindrical coupling structure 18 is similarly divided by apertures 60 into angularly spaced posts 66 which directly and somewhat independently interconnect vibratory diaphragm assembly 22 with the respective peripheral tabs 64. The radial flexibility of those posts depends rather sensitively upon their angular or circumferential width, making a wide range of effective radial stiffness available by selection of that width. Further control is obtainable by varying other factors such as the number of posts, the configuration of their edges and the position of their inner ends, for example. As already indicated, the most suitable post dimensions and form for a particular application is usually determined most conveniently empirically, as by fabricating a series of designs and directly observing their resonant frequencies under the range of temperatures and other parameters that need to be considered in that application.

In the illustrative modification represented in FIG. 4, the coupling section 18*a* is provided with the round openings 70, which are confined to that section and do not penetrate into mounting rim 16*a*, which thus forms a complete annulus. Openings 70 may be considered to divide coupling section 18*a* into a series of generally axial connective arms 76, corresponding broadly to the posts 66 of FIGS. 1 and 2 despite their less complete separation from each other. Those arms are typically less flexible in a radial direction than the clearly separated and more widely spaced posts 66, providing less complete isolation of the vibratory diaphragm proper from any stresses originating in the mounting rim. The structure of FIG. 4 thus represents an illustration of the very large variety of modifications that are available for obtaining a desired degree of such isolation.

A further illustrative embodiment of a diaphragm assembly in accordance with the invention is represented in FIG. 5. The coupling section 18*b* in that figure is free of openings, and is shown somewhat deeper than in the previous forms, illustrating the use of the depth dimension as a parameter by which to provide a desired degree of isolation of the diaphragm assembly from radial stresses in mounting rim 16*a*.

In order to maintain thermal stability of the resonant frequency, the present invention preferably forms the diaphragm member of material having a coefficient of thermal expansion that is closely matched to that of the ceramic sensor. The sensor typically comprises a form of lead zirconium titanate having a coefficient of about $4\times10^{-6}$ per ° C. That is closely matched by the well known nickel-iron-cobalt alloy known by the trademark Kovar, which has a coefficient of about $5\times10^{-6}$. However, especially at quite high temperatures, there remains an appreciable residual tendency for the differential expansion of the sensor relative to the diaphragm member to cause a decrease of resonant frequency with temperature increase.

The materials most suitable for supporting and clamping the rim portion of the diaphragm member, such as stainless steel and aluminum, for example, have coefficients of thermal expansion from two to four times that of Kovar. With such materials a temperature increase causes the support structure to expand faster than the clamped rim, tending to stress the diaphragm proper radially outward and increasing the resonant frequency. The invention utilizes that thermal effect at the clamp to compensate any residual differential expansion of the sensor and diaphragm materials. That is done by selecting the flexibility of the coupling structure to transmit to the diaphragm assembly only the proportion of thermal stress from the clamp that is needed for such compensation. The resonant frequency of the transducer is thereby stabilized against the two sources of thermal disturbance over a wider temperature range than if each source were treated entirely by itself.

Thus, it will be seen that the invention provides a significant improvement in the art of piezoelectric ceramic transducers of resonant type by reducing variations from unit to unit in the resonant frequency, and by making possible the virtual elimination of two important sources of frequency variation with ambient temperature.

I claim:

1. Temperature compensated piezoelectric transducer including a diaphragm member having a peripheral mounting portion and a central sensing portion, a circular piezoelectric ceramic element concentrically mounted on at least one face of said sensing portion and forming therewith a diaphragm assembly, clamping means for rigidly supporting said mounting portion of the diaphragm member, housing means for spacedly enclosing said diaphragm assembly to allow normal mode vibratory flexure thereof at resonant frequency, and electrode means electrically coupled to the faces of said ceramic element and responsive to flexure thereof; further characterized in that said diaphragm member is formed of a material having thermal properties selected to be closely similar to those of said ceramic element, whereby variability of the resonant frequency of said diaphragm assembly due to differential temperature response of diaphragm member and ceramic element is reduced to a small residual variation, said clamping means is formed of a material having thermal properties which differ from those of said diaphragm member and produce radial stress in said mounting portion of the diaphragm member in a direction to cause variation of said resonant frequency larger and opposite to said residual variation, said diaphragm member including an integrally formed radially flexible section interposed between said mounting portion and said sensing portion, which section partially isolates the diaphragm portion from radial stress in the mounting portion, the configuration of said flexible section being selected to transmit to the sensing portion an amount of said radial stress which approximately compensates said residual frequency variation.

2. Method of thermally stabilizing the resonant frequency of a piezoelectric transducer which includes circular diaphragm means having a peripheral mounting portion adapted to be rigidly mounted by clamping means and having a central diaphragm portion carrying a circular concentrically mounted piezoelectric ceramic sensor which forms with said diaphragm portion a vibratory diaphragm assembly, said method comprising forming said diaphragm means of a material having thermal expansion properties different from those of said clamping means and closely similar to those of said ceramic sensor, whereby frequency variability due to differential temperature response of diaphragm member and sensor is reduced to a small residual value, inserting between said mounting portion and said diaphragm portion of the diaphragm member means for partially isolating the diaphragm portion from radial stress in the mounting portion due to differential temperature response of said clamping means, and designing said isolating means to transmit to the diaphragm portion an amount of said radial stress which approximately compensates said residual value of frequency variability.

* * * * *